(12) United States Patent
Li et al.

(10) Patent No.: US 11,251,813 B2
(45) Date of Patent: Feb. 15, 2022

(54) SYSTEM AND METHOD FOR PROCESSING CONTROL INFORMATION

(71) Applicant: ZTE CORPORATION, Guangdong (CN)

(72) Inventors: Liguang Li, Guangdong (CN); Jun Xu, Guangdong (CN); Jin Xu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 16/861,990

(22) Filed: Apr. 29, 2020

(65) Prior Publication Data
US 2020/0259508 A1    Aug. 13, 2020

Related U.S. Application Data

(63) Continuation of application No. PCT/CN2017/111756, filed on Nov. 17, 2017.

(51) Int. Cl.
*H03M 13/25* (2006.01)
*H03M 13/11* (2006.01)
*H03M 13/00* (2006.01)

(52) U.S. Cl.
CPC ..... *H03M 13/255* (2013.01); *H03M 13/1185* (2013.01); *H03M 13/658* (2013.01); *H03M 13/6522* (2013.01)

(58) Field of Classification Search
CPC .......... H03M 13/255; H03M 13/1185; H03M 13/6522; H03M 13/658; H03M 13/6393; H03M 13/6306; H03M 13/6516; H03M 13/35; H03M 13/116; H04L 1/1819; H04L 1/0009; H04L 1/0057
See application file for complete search history.

(56) References Cited

U.S. PATENT DOCUMENTS

| | | | |
|---|---|---|---|
| 2017/0135114 A1 | 5/2017 | Hwang et al. | |
| 2017/0223673 A1 | 8/2017 | Dinan et al. | |
| 2020/0128529 A1* | 4/2020 | Wang | H04L 1/0016 |

(Continued)

FOREIGN PATENT DOCUMENTS

| CN | 101632230 A | 10/2010 |
|---|---|---|
| CN | 102484520 A | 5/2012 |

(Continued)

OTHER PUBLICATIONS

RAN1 "LS on Channel Coding" R4-1710120, R1-1715317, 3GPP TSG RAN WG4 Meeting #84Bis, Dubrovnik, Croatia, Sep. 28, 2017, 18 pages.

(Continued)

*Primary Examiner* — Thien Nguyen
(74) *Attorney, Agent, or Firm* — Duane Morris LLP

(57) ABSTRACT

A system and method for allocating network resources are disclosed herein. In one embodiment, the system and method are configured to perform: determining a redundancy version and a new data indicator indicated by control information; determining a base graph of a low density parity check code based on which of a plurality of predefined conditions the redundancy version, and/or the new data indicator satisfy; and sending a signal comprising information bits that are encoded based on the determined base graph of the low density parity check code.

18 Claims, 5 Drawing Sheets

(56) References Cited

U.S. PATENT DOCUMENTS

| | | | | |
|---|---|---|---|---|
| 2020/0177308 A1* | 6/2020 | Lee | ................... | H03M 13/116 |
| 2020/0213032 A1* | 7/2020 | Yeo | ................... | H04L 27/2602 |
| 2020/0235759 A1* | 7/2020 | Ye  | ................... | H03M 13/116 |
| 2020/0244395 A1* | 7/2020 | Sun | ................... | H03M 13/255 |
| 2020/0287654 A1* | 9/2020 | Xi  | ................... | H04L 1/203 |

FOREIGN PATENT DOCUMENTS

| | | |
|---|---|---|
| CN | 102771169 A  | 11/2012 |
| CN | 106899390 A  | 6/2017 |
| KR | 20120015985 A | 2/2012 |
| WO | 2017088696 A1 | 6/2017 |
| WO | 2017107904 A1 | 6/2017 |

OTHER PUBLICATIONS

Qualcomm Incorporated: "LDPC base graph determination and indication" R1-1713463, 3GPP TSG RAN WG1 #90 , Prague, Czech Republic, Aug. 20, 2017, 5 pages.

Samsung: "Code rate threshold for BG selection" R1-1716026, 3GPP TSG RAN WG1 Meeting NR#3, Nagoya, Japan, Sep. 17, 2017, 5 pages.

\* cited by examiner

SYSTEM AND METHOD FOR PROCESSING CONTROL INFORMATION

TECHNICAL FIELD

The disclosure relates generally to wireless communications and, more particularly, to systems and methods for processing a signal containing control information.

BACKGROUND

In a communication system, a transmitter may encode a packet of data, also known as information bits, to obtain encoded bits, interleave the encoded bits, and map the interleaved bits to modulation symbols. The transmitter may then process and transmit the modulation symbols via a communication channel. The communication channel may distort the data transmission with a particular channel response and further degrade the data transmission with noise and interference. A receiver may obtain received symbols, which may be distorted and degraded versions of the transmitted modulation symbols. The receiver may process the received symbols to recover the transmitted information bits.

The encoding by the transmitter may allow the receiver to reliably recover the transmitted information bits with the degraded received symbols. The transmitter may perform encoding based on a Forward Error Correction (FEC) code that generates redundancy in the code bits, which is typically associated with a Hybrid Automatic Repeat Request (HARQ) technique. The receiver may utilize the redundancy to improve the likelihood of recovering the transmitted information bits.

Various types of FEC codes may be used for encoding. Some common types of FEC codes include convolutional code, Turbo code, and Low Density Parity Check (LDPC) code. A convolutional code or a Turbo code can encode a packet of k information bits and generate a coded packet of approximately r times k code bits, where 1/r is the code rate of the convolutional or Turbo code. A convolutional code can readily encode a packet of any size by passing each information bit through an encoder that can operate on one information bit at a time. A Turbo code can also support different packet sizes by employing two constituent encoders that can operate on one information bit at a time and a code interleaver that can support different packet sizes. An LDPC code may have better performance than convolutional and Turbo codes under certain operating conditions. An example of the LDPC code, typically known as a quasi-cyclic LDPC (QC-LDPC) code, that presents a constructive characteristic thereby allowing low-complexity encoding has gained particular attention.

In a New Radio (NR) communication system, when the transmitter and receiver respectively use the QC-LDPC code for encoding and decoding information bits, two predefined base graphs (BG's), typically known as BG1 (Base Graph 1) and BG2 (Base Graph 2), would be used, wherein the BG1 and BG2 correspond to respective base matrixes. For example, the transmitter selects one of BG1 and BG2 to be used based on various conditions (e.g., a code rate, a modulation order, etc.), lifts the selected BG to retrieve a parity check matrix, and uses the retrieved parity check matrix to encode the information bits to obtain an LDPC codeword. The receiver, on the other end, generally follows the similar operations (e.g., using one of BG1 and BG2) to decode and obtain the information bits.

In some cases, however, the transmitter and receiver may not use a same BG to encode and decode the information bits, respectively. For example, due to distortion or delay of the communication channel, when the receiver misses first transmitted information bits, the receiver may mistakenly treat retransmitted information bits as the first transmitted information bits. As such, the receiver may determine a wrong BG to decode the information bits, which may wrongly decode the information bits. Thus, existing systems and methods to encode and decode information bits using the QC-LDPC code are not entirely satisfactory.

SUMMARY OF THE INVENTION

The exemplary embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the invention.

In one embodiment, a method includes: determining a redundancy version and a new data indicator indicated by control information; determining a base graph of a low density parity check code based on which of a plurality of predefined conditions the redundancy version, and/or the new data indicator satisfy; and sending a signal comprising information bits that are encoded based on the determined base graph of the low density parity check code.

In yet another embodiment, a method includes: receiving control information indicative of a redundancy version and a current logic state of a new data indicator; determining a base graph of a low density parity check code based on which of a plurality of predefined conditions the redundancy version, and/or the new data indicator satisfy; and retrieving information bits from a received signal using the determined base graph of the low density parity check code.

BRIEF DESCRIPTION OF THE DRAWINGS

Various exemplary embodiments of the invention are described in detail below with reference to the following Figures. The drawings are provided for purposes of illustration only and merely depict exemplary embodiments of the invention to facilitate the reader's understanding of the invention. Therefore, the drawings should not be considered limiting of the breadth, scope, or applicability of the invention. It should be noted that for clarity and ease of illustration these drawings are not necessarily drawn to scale.

DETAILED DESCRIPTION OF EXEMPLARY EMBODIMENTS

Various exemplary embodiments of the invention are described below with reference to the accompanying figures to enable a person of ordinary skill in the art to make and use the invention. As would be apparent to those of ordinary skill in the art, after reading the present disclosure, various changes or modifications to the examples described herein can be made without departing from the scope of the invention. Thus, the present invention is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be re-arranged while remaining within the scope of the present invention. Thus, those of ordinary skill in the art will understand that the methods and techniques disclosed herein present various steps or acts in a sample order, and the invention is not limited to the specific order or hierarchy presented unless expressly stated otherwise.

Figure 1:
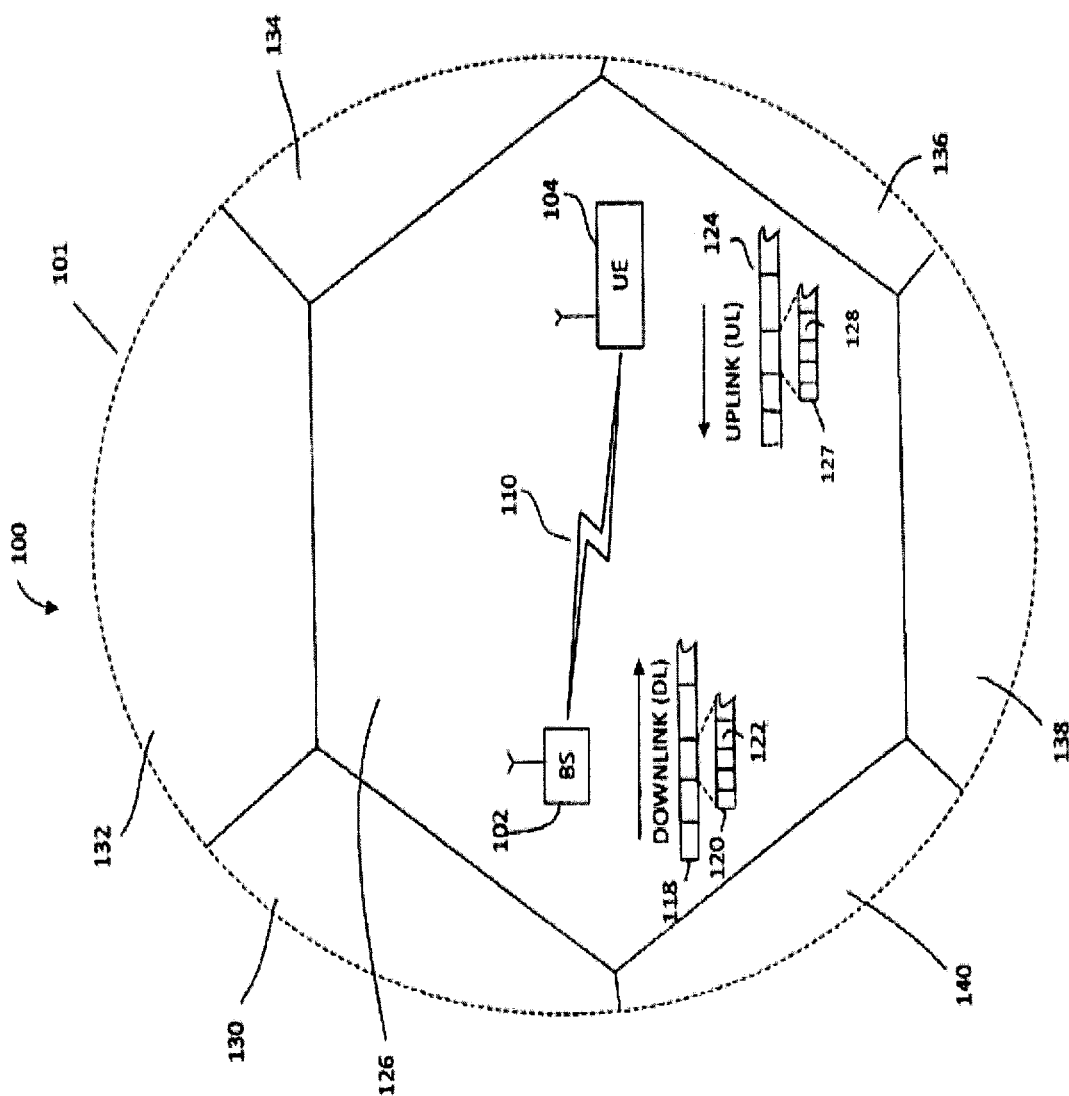
FIG. 1 illustrates an exemplary cellular communication network in which techniques disclosed herein may be implemented, in accordance with an embodiment of the present disclosure.

FIG. 1 illustrates an exemplary wireless communication network 100 in which techniques disclosed herein may be implemented, in accordance with an embodiment of the present disclosure. The exemplary communication network 100 includes a base station 102 (hereinafter "BS 102") and a user equipment device 104 (hereinafter "UE 104") that can communicate with each other via a communication link 110 (e.g., a wireless communication channel), and a cluster of notional cells 126, 130, 132, 134, 136, 138 and 140 overlaying a geographical area 101. In FIG. 1, the BS 102 and UE 104 are contained within the geographic boundary of cell 126. Each of the other cells 130, 132, 134, 136, 138 and 140 may include at least one base station operating at its allocated bandwidth to provide adequate radio coverage to its intended users. For example, the base station 102 may operate at an allocated channel transmission bandwidth to provide adequate coverage to the UE 104. The base station 102 and the UE 104 may communicate via a downlink radio frame 118, and an uplink radio frame 124 respectively. Each radio frame 118/124 may be further divided into sub-frames 120/127 which may include data symbols 122/128. In the present disclosure, the BS 102 and UE 104 are described herein as non-limiting examples of "communication nodes," generally, which can practice the methods disclosed herein. Such communication nodes may be capable of wireless and/or wired communications, in accordance with various embodiments of the invention.

Figure 2:
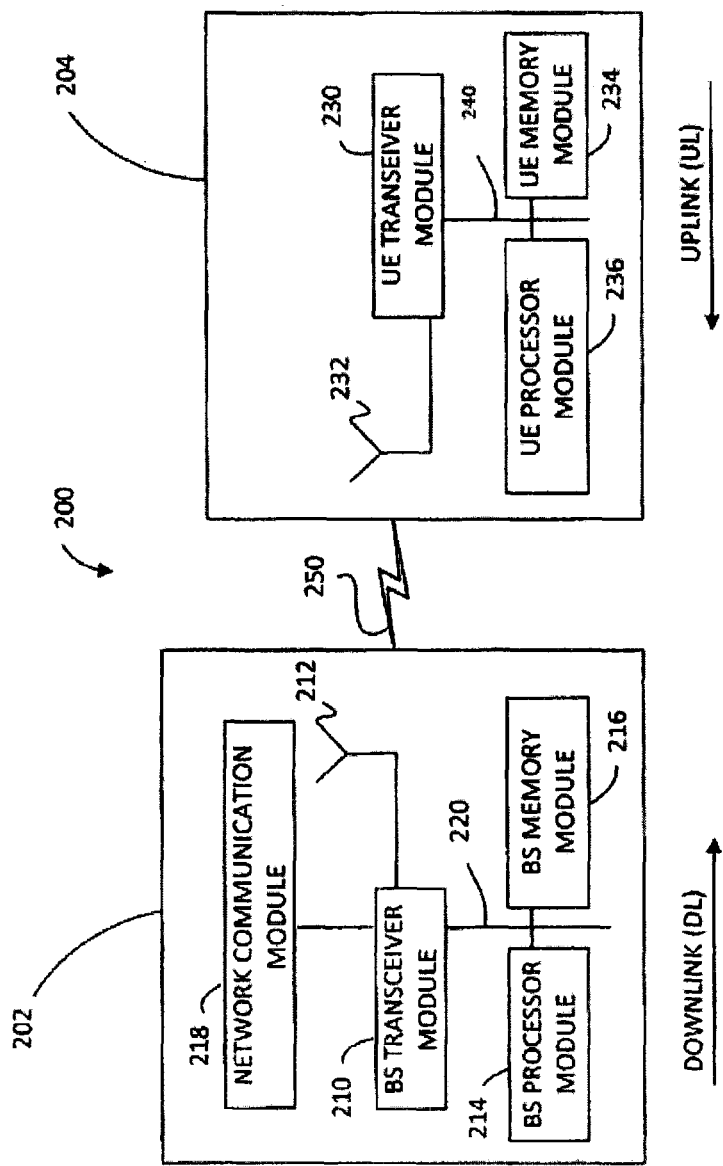
FIG. 2 illustrates block diagrams an exemplary base station and a user equipment device, in accordance with some embodiments of the present disclosure.

FIG. 2 illustrates a block diagram of an exemplary wireless communication system 200 for transmitting and receiving wireless communication signals, e.g., OFDM/OFDMA signals, in accordance with some embodiments of the invention. The system 200 may include components and elements configured to support known or conventional operating features that need not be described in detail herein. In one exemplary embodiment, system 200 can be used to transmit and receive data symbols in a wireless communication environment such as the wireless communication environment 100 of FIG. 1, as described above.

System 200 generally includes a base station 202 (hereinafter "BS 202") and a user equipment device 204 (hereinafter "UE 204"). The BS 202 includes a BS (base station) transceiver module 210, a BS antenna 212, a BS processor module 214, a BS memory module 216, and a network communication module 218, each module being coupled and interconnected with one another as necessary via a data communication bus 220. The UE 204 includes a UE (user equipment) transceiver module 230, a UE antenna 232, a UE memory module 234, and a UE processor module 236, each module being coupled and interconnected with one another as necessary via a data communication bus 240. The BS 202 communicates with the UE 204 via a communication channel 250, which can be any wireless channel or other medium known in the art suitable for transmission of data as described herein.

As would be understood by persons of ordinary skill in the art, system 200 may further include any number of modules other than the modules shown in FIG. 2. Those skilled in the art will understand that the various illustrative blocks, modules, circuits, and processing logic described in connection with the embodiments disclosed herein may be implemented in hardware, computer-readable software, firmware, or any practical combination thereof. To clearly illustrate this interchangeability and compatibility of hardware, firmware, and software, various illustrative components, blocks, modules, circuits, and steps are described generally in terms of their functionality. Whether such functionality is implemented as hardware, firmware, or software depends upon the particular application and design constraints imposed on the overall system. Those familiar with the concepts described herein may implement such functionality in a suitable manner for each particular application, but such implementation decisions should not be interpreted as limiting the scope of the present invention.

In accordance with some embodiments, the UE transceiver 230 may be referred to herein as an "uplink" transceiver 230 that includes a RF transmitter and receiver circuitry that are each coupled to the antenna 232. A duplex switch (not shown) may alternatively couple the uplink transmitter or receiver to the uplink antenna in time duplex fashion. Similarly, in accordance with some embodiments, the BS transceiver 210 may be referred to herein as a "downlink" transceiver 210 that includes RF transmitter and receiver circuitry that are each coupled to the antenna 212. A downlink duplex switch may alternatively couple the downlink transmitter or receiver to the downlink antenna 212 in time duplex fashion. The operations of the two transceivers 210 and 230 are coordinated in time such that the uplink receiver is coupled to the uplink antenna 232 for reception of transmissions over the wireless transmission link 250 at the same time that the downlink transmitter is coupled to the downlink antenna 212. Preferably there is close time synchronization with only a minimal guard time between changes in duplex direction.

The UE transceiver 230 and the base station transceiver 210 are configured to communicate via the wireless data communication link 250, and cooperate with a suitably configured RF antenna arrangement 212/232 that can support a particular wireless communication protocol and modulation scheme. In some exemplary embodiments, the UE transceiver 608 and the base station transceiver 602 are configured to support industry standards such as the Long Term Evolution (LTE) and emerging 5G standards, and the like. It is understood, however, that the invention is not necessarily limited in application to a particular standard and associated protocols. Rather, the UE transceiver 230 and the base station transceiver 210 may be configured to support alternate, or additional, wireless data communication protocols, including future standards or variations thereof.

In accordance with various embodiments, the BS 202 may be an evolved node B (eNB), a serving eNB, a target eNB, a femto station, or a pico station, for example. In some embodiments, the UE 204 may be embodied in various types of user devices such as a mobile phone, a smart phone, a personal digital assistant (PDA), tablet, laptop computer, wearable computing device, etc. The processor modules 214 and 236 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like. A processor may also be implemented as a combination of computing devices, e.g., a combination of a digital signal processor and a microprocessor, a plurality of microprocessors, one or more microprocessors in conjunction with a digital signal processor core, or any other such configuration.

Furthermore, the steps of a method or algorithm described in connection with the embodiments disclosed herein may be embodied directly in hardware, in firmware, in a software module executed by processor modules 214 and 236, respectively, or in any practical combination thereof. The memory modules 216 and 234 may be realized as RAM memory, flash memory, ROM memory, EPROM memory, EEPROM memory, registers, a hard disk, a removable disk, a CD-ROM, or any other form of storage medium known in the art. In this regard, memory modules 216 and 234 may be coupled to the processor modules 210 and 230, respectively, such that the processors modules 210 and 230 can read information from, and write information to, memory modules 216 and 234, respectively. The memory modules 216 and 234 may also be integrated into their respective processor modules 210 and 230. In some embodiments, the memory modules 216 and 234 may each include a cache memory for storing temporary variables or other intermediate information during execution of instructions to be executed by processor modules 210 and 230, respectively. Memory modules 216 and 234 may also each include non-volatile memory for storing instructions to be executed by the processor modules 210 and 230, respectively.

The network communication module 218 generally represents the hardware, software, firmware, processing logic, and/or other components of the base station 202 that enable bi-directional communication between base station transceiver 602 and other network components and communication nodes configured to communication with the base station 202. For example, network communication module 218 may be configured to support internet or WiMAX traffic. In a typical deployment, without limitation, network communication module 218 provides an 802.3 Ethernet interface such that base station transceiver 210 can communicate with a conventional Ethernet based computer network. In this manner, the network communication module 218 may include a physical interface for connection to the computer network (e.g., Mobile Switching Center (MSC)). The terms "configured for," "configured to" and conjugations thereof, as used herein with respect to a specified operation or function, refer to a device, component, circuit, structure, machine, signal, etc., that is physically constructed, programmed, formatted and/or arranged to perform the specified operation or function.

Referring again to FIG. 1, as discussed above, when a transmitter (e.g., the BS 102) uses a BG (base graph) of a QC-LDPC code to encode information bits and transmit to a receiver (e.g., the UE 104), the UE 104 may mistakenly use a wrong (e.g., inconsistent) BG to decode the information bits, wherein such encoded information bits has been retransmitted as the UE 104 misses a first transmission. In this regard, the present disclosure provides various embodiments of systems and methods to use downlink control information (DCI), which is transmitted from a BS and received by a UE, to cause the BS and UE to use a consistent BG to encode and decode information bits, respectively. More specifically, in accordance with some embodiments, the BS and UE may respectively use various information contained in the DCI to accurately determine the correct BG by checking whether the various information satisfies either a first or second predefined condition.

Figure 3:
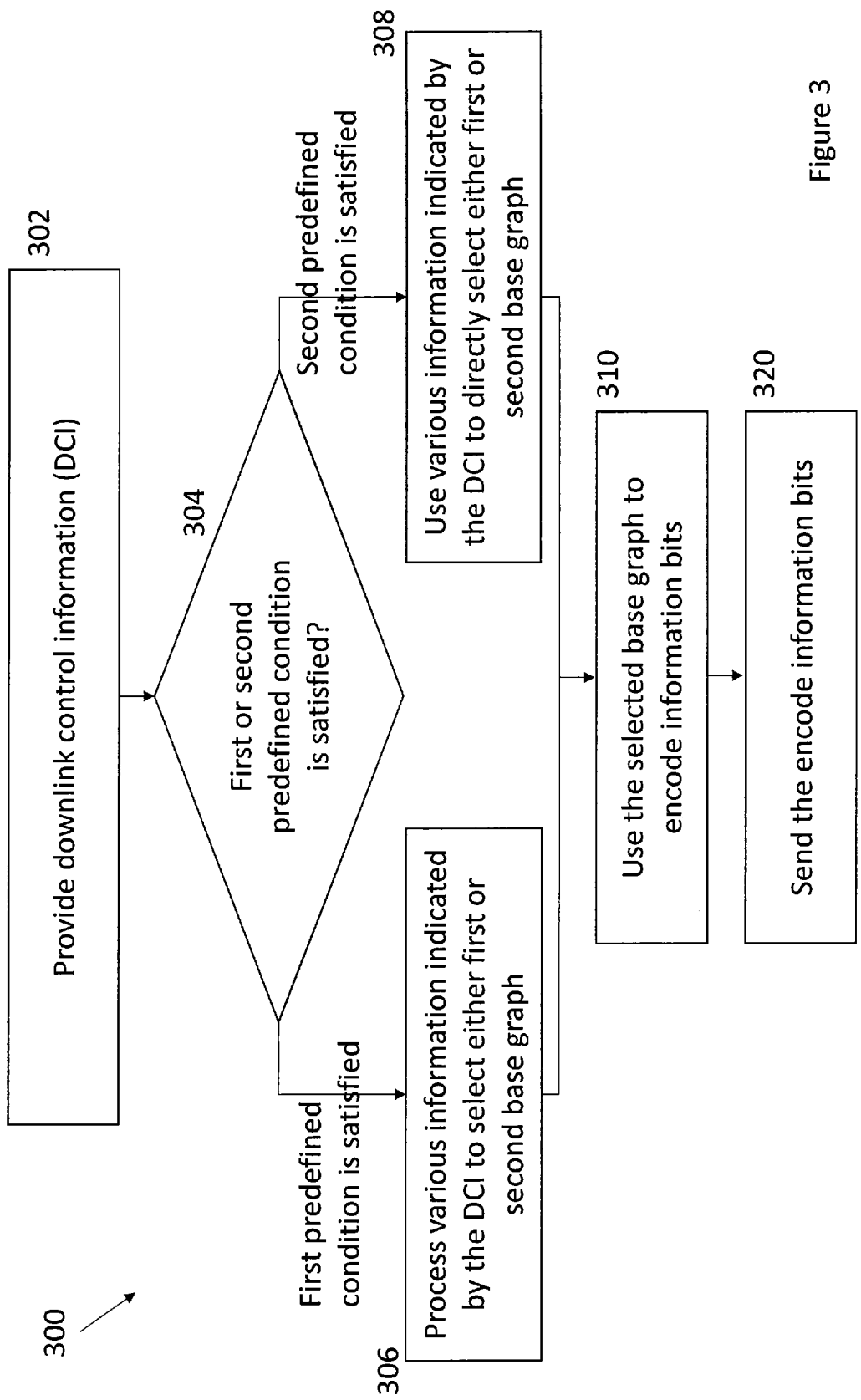
FIG. 3 illustrates a flow chart of an exemplary method to transmit information bits encoded by a QC-LDPC code, in accordance with some embodiments of the present disclosure.

FIG. 3 illustrates a flow chart of an exemplary method 300 performed by a BS to transmit information bits encoded by a QC-LDPC code, in accordance with some embodiments. The illustrated embodiment of the method 300 is merely an example. Therefore, it should be understood that any of a variety of operations may be omitted, re-sequenced, and/or added while remaining within the scope of the present disclosure.

In some embodiments, the method 300 starts with operation 302 in which downlink control information (DCI) is provided. According to some embodiments, the DCI includes various information such as, for example, a modulation and coding scheme (MCS) index (hereinafter "$I_{MCS}$"), a new data indicator (hereinafter "NDI"), a redundancy version (hereinafter "RV"), a number of physical resource blocks (hereinafter "PRB"), etc. The RV as used herein is typically referred to redundancy bits when HARQ is used to retransmit information bits. Next, the method 300 proceeds to determination operation 304 in which the BS determines whether a first or second predefined condition is satisfied. In some embodiments, the first predefined condition includes at least one of the following: whether the RV is equal to RV0, whether a current logic state of the NDI is equal to a logic "0," and whether the NDI presents a transition to a different logic state (e.g., whether the NDI has been toggled to a value different from a previously transmitted value, which indicates a first transmission); and the second predefined condition includes at least one of the following: whether the RV is equal to RV1, RV2, or RV3, whether a current logic state of the NDI is equal to a logic "1," and whether the NDI lacks a transition to a different logic state (e.g., whether the NDI has not been toggled to a value different from a previously transmitted value, which indicates a retransmission). In some embodiments, the presence of the NDI transition is typically referred to as a "toggled NDI," and the lack of the NDI transition is typically referred to as a "non-toggled NDI." When the first predefined condition is satisfied, the method 300 proceeds to operation 306; and when the second predefined condition is satisfied, the method 300 proceeds to operation 308. In some embodiments, in operation 306, the BS is configured to process the various information contained in the DCI to select one from the above-mentioned BG1 and BG2 that are predefined by the QC-LDPC code; and on the other hand, in operation 308, the BS is configured to use the various information contained in the DCI to directly select one from the above-mentioned BG1 and BG2 (i.e., no further processing on the various information). After the BG is selected either at operation 306 or 308, the method 300 continues to operation 310 in which the BS uses the selected BG to encode information bits. In some embodiments, in operation 310, in addition to at least one encoding process using the selected BG being performed, one or more further steps (e.g., a rate matching step, a interleaving step, a symbol modulation step, etc.) may be performed after the information bits have been encoded. The method 300 continues to operation 312 in which the BS sends the encoded information bits. As mentioned above, since one or more further steps are performed after the information bits are encoded, in some embodiments, the BS may send the encoded information bits as one or more symbols.

In some embodiments, when the first predefined condition is satisfied (operation 306), i.e., the RV being equal to RV0, the current logic state of the NDI being equal to a logic 0, and/or the NDI transitioning to a different logic state, the BS uses the $I_{MCS}$ (indicated by the DCI) to determine a modulation order ($Q_m$) and a code rate (R). More specifically, the BS may refer to a predefined table (e.g., Table 1 as shown below) to determine which modulation order and code rate that the $I_{MCS}$ corresponds to.

TABLE 1

| MCS Index $I_{MCS}$ | Modulation Order $Q_m$ | Code Rate R × [1024] |
| --- | --- | --- |
| 0 | 2 | 121 |
| 1 | 2 | 171 |
| 2 | 2 | 120 |
| 3 | 2 | 156.5 |
| 4 | 2 | 193 |
| 5 | 2 | 250.5 |
| 6 | 2 | 308 |
| 7 | 2 | 378.5 |
| 8 | 2 | 449 |
| 9 | 2 | 525.5 |
| 10 | 4 | 602 |
| 11 | 4 | 679 |
| 12 | 4 | 756 |
| 13 | 4 | 378 |
| 14 | 4 | 434 |
| 15 | 4 | 490 |
| 16 | 4 | 553 |
| 17 | 6 | 616 |
| 18 | 6 | 657.5 |
| 19 | 6 | 699 |
| 20 | 6 | 774.75 |
| 21 | 6 | 850.5 |
| 22 | 6 | 924.75 |
| 23 | 6 | 616.5 |
| 24 | 6 | 666 |
| 25 | 6 | 719 |
| 26 | 6 | 772 |
| 27 | 6 | 822.5 |
| 28 | 6 | 873 |
| 29 | 2 | reserved |
| 30 | 4 | |
| 31 | 6 | |

As shown in Table 1, there are a total of 32 different values of $I_{MCS}$. In some embodiments, such 32 different values of $I_{MCS}$ may be grouped into a plurality of subsets: $I_{MCS}$Set0 and $I_{MCS}$Set1. For example, $I_{MCS}$Set0 may be presented as $I_{MCS}$Set0={0, 1, 2, 3, 4, 5, 6, 7, 8, 9, 10, 11, 12, 13, 14, 15, 16, 17, 18, 19, 20, 21, 22, 23, 24, 25, 26, 27, 28} and $I_{MCS}$Set1 may be presented as $I_{MCS}$Set1={29, 30, 31}. It is noted that $I_{MCS}$Set0 and $I_{MCS}$Set1 have no intersection, and $I_{MCS}$Set0 and $I_{MCS}$Set1 form a union. In some embodiments, $I_{MCS}$Set1 may be grouped for retransmission data or for reserved use.

According to $I_{MCS}$ (indicated by the DCI), a single combination of the modulation order ($Q_m$) and code rate (R) can be determined. Accordingly, the BS uses the PRB (also indicated by the DCI) to estimate a number of Resource Elements ($N_{RE}$), and determine a layer parameter "v," wherein such v is synonymous with "stream." In particular, for a Multiple-Input-Multiple-Output (MIMO) BS, at least two layers (i.e., v=2) may be used, and such v is always less than or equal to a number of antennas of the MIMO BS. In some embodiments, the BS can use $Q_m$, R, $N_{RE}$ and v to determine a transport block size (TBS). More specifically, TBS=floor (TBS'/8)×8, wherein TBS'=$N_{RE}$×v×$Q_m$×R, and "floor" represents a floor function $\lfloor x \rfloor$ that gives the largest integer less than or equal to x. After the BS estimates TBS, in some embodiments, the BS can use R and TBS to select either BG1 or BG2, which will be discussed below with respect to FIG. 4.

Figure 4:
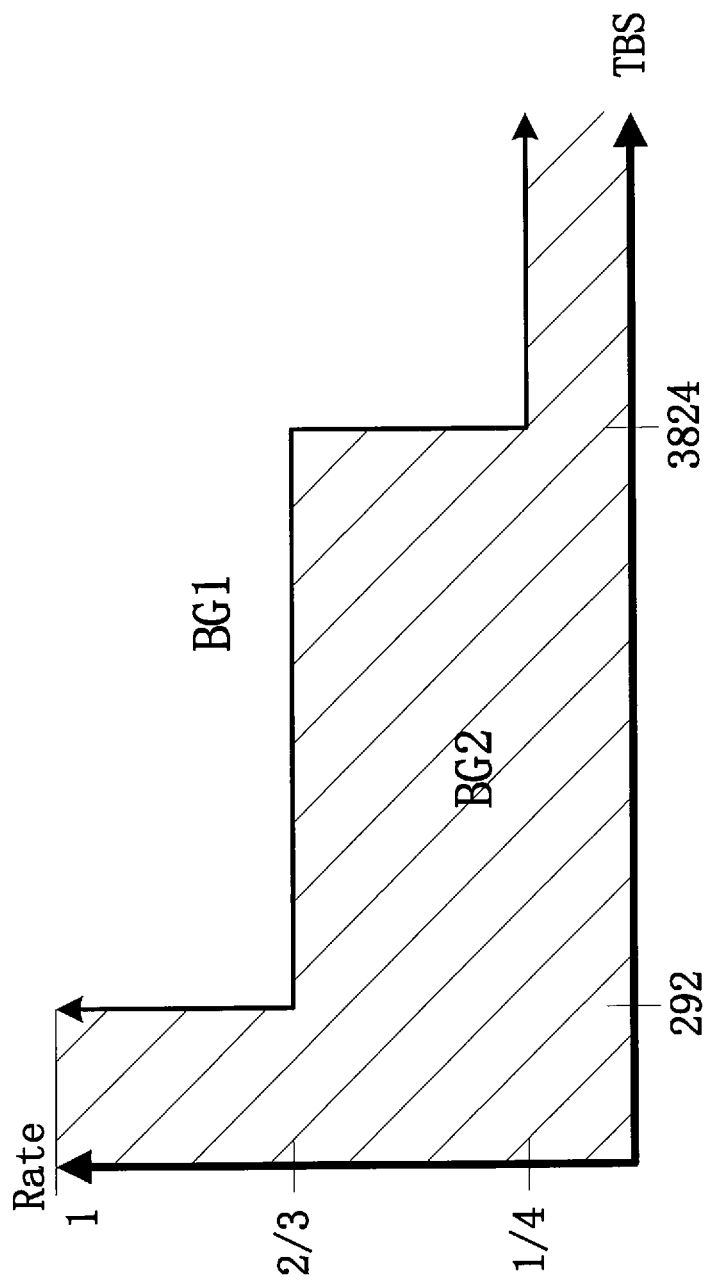
FIG. 4 illustrates an exemplary diagram showing how a base graph 1 and a base graph each corresponds to a transport block size and a code rate, in accordance with some embodiments of the present disclosure.

FIG. 4 illustrates an exemplary diagram showing how BG1 and BG2 each corresponds to the TBS and R, in accordance with various embodiments. As shown in FIG. 4, the BS may determine the BG to be used as BG1 when estimated TBS is between 292 and 3824 and estimated R is greater than ⅔, or when estimated TBS is greater than 3824 and estimated R is greater than ¼; and the BS may determine the BG to be used as BG2 when estimated TBS is less than 292, when estimated TBS is between 292 and 3824 and estimated R is less than ⅔, or when estimated TBS is greater than 3824 and estimated R is less than ¼.

On the other hand, in some embodiments, when the second predefined condition is satisfied (operation 308), i.e., the RV being equal to RV1, RV2, or RV3, the current logic state of the NDI being equal to a logic 1, and/or the NDI not transitioning to a different logic state, the BS uses the $I_{MCS}$ (indicated by the DCI) to directly select either BG1 or BG2.

In an embodiment, the BS groups the 32 different values of $I_{MCS}$ into a plurality of subsets: $I_{MCS}$Set2, $I_{MCS}$Set3, and $I_{MCS}$Set4. When the $I_{MCS}$ (indicated by the DCI) belongs to $I_{MCS}$Set2, the BS selects the BG1; and when the $I_{MCS}$ (indicated by the DCI) belongs to $I_{MCS}$Set3, the BS selects the BG2, wherein $I_{MCS}$Set4 may be grouped for retransmission data or for reserved use.

In an example, $I_{MCS}$Set2 may be grouped as each $I_{MCS}$ in $I_{MCS}$Set2 being an even integer, i.e., $I_{MCS}$Set2={0, 2, 4, 6, 8, 10, 12, 14, 16, 18, 20, 22, 24, 26, 28}, $I_{MCS}$Set3 may be grouped as each $I_{MCS}$ in $I_{MCS}$Set3 being an odd integer, i.e., $I_{MCS}$Set3={1, 3, 5, 7, 9, 11, 13, 15, 17, 19, 21, 23, 25, 27}, and the reserved $I_{MCS}$Set4={29, 30, 31}. Alternatively, $I_{MCS}$Set3 may be grouped as each $I_{MCS}$ in $I_{MCS}$Set3 being an even integer, i.e., $I_{MCS}$Set3={0, 2, 4, 6, 8, 10, 12, 14, 16, 18, 20, 22, 24, 26, 28}, $I_{MCS}$Set2 may be grouped as each $I_{MCS}$ in $I_{MCS}$Set2 being an odd integer, i.e., $I_{MCS}$Set2={1, 3, 5, 7, 9, 11, 13, 15, 17, 19, 21, 23, 25, 27}, and the reserved $I_{MCS}$Set4={29, 30, 31}. It is noted that any two of $I_{MCS}$Set2, $I_{MCS}$Set3, and $I_{MCS}$Set4 have no intersection, and $I_{MCS}$Set2, $I_{MCS}$Set3, and $I_{MCS}$Set4 form a union.

In another example, the grouped subsets $I_{MCS}$Set2 and $I_{MCS}$Set3 may satisfy the following criterion: at least $b_0$% of $I_{MCS}$ in $I_{MCS}$Set2 that each has a remainder after a division of the respective $I_{MCS}$ by an even integer "a" being less than "a/2", and at least $b_1$% of $I_{MCS}$ in $I_{MCS}$Set3 that each has a remainder after a division of the respective $I_{MCS}$ by the even integer "a" being greater than or equal to "a/2", and wherein $b_0$ is a real number greater than 75 and less than 100 and $b_1$ is a real number greater than 75 and less than 100. In yet another example, the grouped subsets $I_{MCS}$Set2 and $I_{MCS}$Set3 may satisfy the following criterion: at least 60% of a total number of $I_{MCS}$ in $I_{MCS}$Set2 is greater than "N'," and at least 60% of a total number of $I_{MCS}$ in $I_{MCS}$Set3 is less than "N'," and wherein N' is equal to a sum of the total number of $I_{MCS}$ in $I_{MCS}$Set2 and the total number of $I_{MCS}$ in $I_{MCS}$Set3.

In another embodiment, the BS may refer to a predefined table (e.g., Table 2 as shown below) to determine which BG (either BG1 or BG2) that the $I_{MCS}$ corresponds to.

TABLE 2

| MCS Index $I_{MCS}$ | Modulation Order $Q_m$ | Code Rate R × [1024] | Base Graph Index |
|---|---|---|---|
| 0 | 2 | 121 | 1 |
| 1 | 2 | 171 | 2 |
| 2 | 2 | 120 | 1 |
| 3 | 2 | 156.5 | 2 |
| 4 | 2 | 193 | 1 |
| 5 | 2 | 250.5 | 2 |
| 6 | 2 | 308 | 1 |
| 7 | 2 | 378.5 | 2 |
| 8 | 2 | 449 | 1 |
| 9 | 2 | 525.5 | 2 |
| 10 | 4 | 602 | 1 |
| 11 | 4 | 679 | 2 |
| 12 | 4 | 756 | 1 |
| 13 | 4 | 378 | 2 |
| 14 | 4 | 434 | 1 |
| 15 | 4 | 490 | 2 |
| 16 | 4 | 553 | 1 |
| 17 | 6 | 616 | 2 |
| 18 | 6 | 657.5 | 1 |
| 19 | 6 | 699 | 2 |
| 20 | 6 | 774.75 | 1 |
| 21 | 6 | 850.5 | 2 |
| 22 | 6 | 924.75 | 1 |
| 23 | 6 | 616.5 | 2 |
| 24 | 6 | 666 | 1 |
| 25 | 6 | 719 | 2 |
| 26 | 6 | 772 | 1 |
| 27 | 6 | 822.5 | 2 |
| 28 | 6 | 873 | 1 |
| 29 | 2 | reserved | |
| 30 | 4 | | |
| 31 | 6 | | |

As shown in Table 2, each $I_{MCS}$ not only corresponds to a single combination of modulation order ($Q_m$) and a code rate (R) but also to a respective BG index (either 1 or 2). In some embodiments, BG index 1 is associated with BG1, and BG index 2 is associated with BG2. It is noted that the above-described criteria that $I_{MCS}$Set2 and $I_{MCS}$Set3 follow may be applied to Table 2, in accordance with some embodiments.

Referring still to operation 308 of the method 300 in FIG. 3 (i.e., the second predefined condition is satisfied), in some embodiments, the BS may use the $I_{MCS}$ (indicated by the DCI) and the code rate (R), corresponding to the indicated $I_{MCS}$, to directly select either BG1 or BG2. More specifically, when R is greater than $R_1$, the BS selects BS1; and when R is less than or equal to $R_2$, the BS selects BS2, wherein $R_1$ and $R_2$ are each a real number less than 1, and $R_1$ is greater than $R_2$.

Referring still to operation 308 of the method 300 in FIG. 3 (i.e., the second predefined condition is satisfied), in some embodiments, the BS may use the $I_{MCS}$ and the number of physical resource blocks (PRB), both indicated by the DCI, to directly select either BG1 or BG2. More specifically, the BS selects BG1, when a remainder after division of $I_{MCS}$ by 2 is equal to a remainder after division of PRB by 2; and the BS selects BG2, when a remainder after division of $I_{MCS}$ by 2 is not equal to a remainder after division of PRB by 2. Alternatively, the BS selects BG2, when a remainder after division of $I_{MCS}$ by 2 is equal to a remainder after division of PRB by 2; and the BS selects BG1, when a remainder after division of $I_{MCS}$ by 2 is not equal to a remainder after division of PRB by 2.

Referring still to operation 308 of the method 300 in FIG. 3 (i.e., the second predefined condition is satisfied), in some embodiments, the BS may use a relationship between a first efficiency value derived from a MCS table, which will be shown below, and a second efficiency value indicated in a channel quality indicator (CQI) table, which will be shown below, to directly select either BG1 or BG2. More specifically, the first efficiency value is calculated as a product of a modulation order ($Q_m$) and a code rate (R) that correspond to a single $I_{MCS}$, which is indicated by the DCI, and the second efficiency value is listed as one of a plurality of pre-calculated efficiency values in the CQI table. Accordingly, the BS may group the 32 different values of $I_{MCS}$ into another plurality of subsets: $I_{MCS}$Set5, $I_{MCS}$Set6, $I_{MCS}$Set7, and $I_{MCS}$Set8, wherein each $I_{MCS}$'s corresponding first efficiency value in $I_{MCS}$Set5 is equal to any of the plurality of pre-calculated efficiency values in the CQI table (i.e., the second efficiency value), each $I_{MCS}$'s corresponding first efficiency value in $I_{MCS}$Set6 is equal to an average of any two adjacent ones of the plurality of pre-calculated efficiency values (i.e., the respective pre-calculated efficiency values of two adjacent CQI indexes) in the CQI table, each $I_{MCS}$'s corresponding first efficiency value in $I_{MCS}$Set7 is not equal to any first efficiency values included in $I_{MCS}$Set5 and $I_{MCS}$Set6, and $I_{MCS}$Set8 is reserved for retransmission or for future use.

In some embodiments, an exemplary CQI table with a maximum modulation order of 256QAM is shown in Table 3 and an exemplary MCS table for the use of sending a PDSCH (Physical Downlink Shared Channel) signal with a maximum modulation order of 8 (256QAM) is shown in Table 4. According to the above-discussed grouping principles, in some embodiments, $I_{MCS}$Set5={1, 3, 5, 7, 9, 11, 13, 15, 17, 19, 21, 23, 25, 27}, $I_{MCS}$Set6={2, 4, 6, 8, 10, 12, 14, 16, 18, 20, 22, 24, 26}, $I_{MCS}$Set7={0}, and $I_{MCS}$Set8={28, 29, 30, 31}. Further, a maximum code rate in such an MCS table (e.g., Table 4) is equal to 0.95+Δx wherein Δx is a real number between −0.01 and +0.01. For example, as listed in Table 4, the maximum code rate indicated in the MCS table is equal to 972/1024=0.9492 wherein Δx=0.008.

TABLE 3

| CQI index | Modulation order | code rate × 1024 | efficiency |
|---|---|---|---|
| 0 | | out of range | |
| 1 | QPSK | 78 | 0.1523 |
| 2 | QPSK | 193 | 0.3770 |
| 3 | QPSK | 449 | 0.8770 |
| 4 | 16QAM | 378 | 1.4766 |
| 5 | 16QAM | 490 | 1.9141 |
| 6 | 16QAM | 616 | 2.4063 |
| 7 | 64QAM | 466 | 2.7305 |
| 8 | 64QAM | 567 | 3.3223 |
| 9 | 64QAM | 666 | 3.9023 |
| 10 | 64QAM | 772 | 4.5234 |
| 11 | 64QAM | 873 | 5.1152 |
| 12 | 256QAM | 711 | 5.5547 |
| 13 | 256QAM | 797 | 6.2266 |
| 14 | 256QAM | 885 | 6.9141 |
| 15 | 256QAM | 972 | 7.5938 |

TABLE 4

| MCS Index $I_{MCS}$ | Modulation Order $Q_m$ | code rate × 1024 |
|---|---|---|
| 0 | 2 | 120 |
| 1 | 2 | 193 |
| 2 | 2 | 321 |
| 3 | 2 | 449 |
| 4 | 2 | 603 |
| 5 | 4 | 378 |
| 6 | 4 | 434 |
| 7 | 4 | 490 |
| 8 | 4 | 553 |
| 9 | 4 | 616 |
| 10 | 4 | 658 |
| 11 | 6 | 466 |
| 12 | 6 | 517 |
| 13 | 6 | 567 |
| 14 | 6 | 617 |
| 15 | 6 | 666 |
| 16 | 6 | 719 |
| 17 | 6 | 772 |
| 18 | 6 | 823 |
| 19 | 6 | 873 |
| 20 | 8 | 683 |
| 21 | 8 | 711 |
| 22 | 8 | 754 |
| 23 | 8 | 797 |
| 24 | 8 | 841 |
| 25 | 8 | 885 |
| 26 | 8 | 929 |
| 27 | 8 | 972 |
| 28 | 2 | reserved |
| 29 | 4 | |
| 30 | 6 | |
| 31 | 8 | |

In some embodiments, another exemplary CQI table with a maximum modulation order of 64QAM is shown in Table 5.

TABLE 5

| CQI index | Modulation order | code rate × 1024 | efficiency |
|---|---|---|---|
| 0 | | out of range | |
| 1 | QPSK | 78 | 0.1523 |
| 2 | QPSK | 120 | 0.2344 |
| 3 | QPSK | 193 | 0.3770 |
| 4 | QPSK | 308 | 0.6016 |
| 5 | QPSK | 449 | 0.8770 |
| 6 | QPSK | 602 | 1.1758 |
| 7 | 16QAM | 378 | 1.4766 |
| 8 | 16QAM | 490 | 1.9141 |
| 9 | 16QAM | 616 | 2.4063 |
| 10 | 64QAM | 466 | 2.7305 |
| 11 | 64QAM | 567 | 3.3223 |
| 12 | 64QAM | 666 | 3.9023 |
| 13 | 64QAM | 772 | 4.5234 |
| 14 | 64QAM | 873 | 5.1152 |
| 15 | 64QAM | 948 | 5.5547 |

In some embodiments, another exemplary MCS table for the use of sending a PDSCH (Physical Downlink Shared Channel) signal with a maximum modulation order of 6 (64QAM) is shown in Table 6.

TABLE 6

| MCS Index $I_{MCS}$ | Modulation Order $Q_m$ | code rate × 1024 |
|---|---|---|
| 0 | 2 | 120 |
| 1 | 2 | 157 |
| 2 | 2 | 193 |
| 3 | 2 | 251 |
| 4 | 2 | 308 |
| 5 | 2 | 379 |
| 6 | 2 | 449 |
| 7 | 2 | 526 |
| 8 | 2 | 602 |
| 9 | 2 | 679 |
| 10 | 4 | 340 |
| 11 | 4 | 378 |
| 12 | 4 | 434 |
| 13 | 4 | 490 |
| 14 | 4 | 553 |
| 15 | 4 | 616 |
| 16 | 4 | 658 |
| 17 | 6 | 438 |
| 18 | 6 | 466 |
| 19 | 6 | 517 |
| 20 | 6 | 567 |
| 21 | 6 | 617 |
| 22 | 6 | 666 |
| 23 | 6 | 719 |
| 24 | 6 | 772 |
| 25 | 6 | 823 |
| 26 | 6 | 873 |
| 27 | 6 | 911 |
| 28 | 6 | 948 |
| 29 | 2 | reserved |
| 30 | 4 | |
| 31 | 6 | |

In some embodiments, an exemplary MCS table for the use of sending a PUSCH (Physical Uplink Shared Channel) signal with a maximum modulation order of 6 (64QAM) using CP-OFDM (Cyclic Prefix Orthogonal Frequency Division Multiplexing) is shown in Table 7.

TABLE 7

| MCS Index $I_{MCS}$ | Modulation Order $Q_m$ | code rate × 1024 |
|---|---|---|
| 0 | 2 | 100 |
| 1 | 2 | 130 |
| 2 | 2 | 161 |
| 3 | 2 | 209 |
| 4 | 2 | 257 |
| 5 | 2 | 315 |
| 6 | 2 | 374 |
| 7 | 2 | 438 |
| 8 | 2 | 502 |
| 9 | 2 | 566 |
| 10 | 2 | 630 |
| 11 | 4 | 315 |
| 12 | 4 | 362 |
| 13 | 4 | 408 |
| 14 | 4 | 461 |
| 15 | 4 | 513 |
| 16 | 4 | 548 |
| 17 | 4 | 583 |
| 18 | 4 | 646 |
| 19 | 4 | 709 |
| 20 | 4 | 771 |
| 21 | 6 | 514 |
| 22 | 6 | 555 |
| 23 | 6 | 599 |
| 24 | 6 | 643 |
| 25 | 6 | 685 |
| 26 | 6 | 727 |
| 27 | 6 | 759 |
| 28 | 6 | 790 |
| 29 | 2 | reserved |
| 30 | 4 | |
| 31 | 6 | |

In some embodiments, yet another MCS table for the use of sending a PUSCH (Physical Uplink Shared Channel)

signal with a maximum modulation order of 8 (256QAM) using CP-OFDM (Cyclic Prefix Orthogonal Frequency Division Multiplexing) is shown in Table 8.

TABLE 8

| MCS Index $I_{MCS}$ | Modulation Order $Q_m$ | code rate × 1024 |
|---|---|---|
| 0 | 2 | 100 |
| 1 | 2 | 161 |
| 2 | 2 | 268 |
| 3 | 2 | 374 |
| 4 | 2 | 502 |
| 5 | 2 | 630 |
| 6 | 4 | 362 |
| 7 | 4 | 408 |
| 8 | 4 | 461 |
| 9 | 4 | 513 |
| 10 | 4 | 583 |
| 11 | 4 | 646 |
| 12 | 4 | 709 |
| 13 | 4 | 771 |
| 14 | 6 | 555 |
| 15 | 6 | 599 |
| 16 | 6 | 643 |
| 17 | 6 | 685 |
| 18 | 6 | 727 |
| 19 | 6 | 790 |
| 20 | 6 | 838 |
| 21 | 6 | 886 |
| 22 | 8 | 701 |
| 23 | 8 | 738 |
| 24 | 8 | 764 |
| 25 | 8 | 821 |
| 26 | 8 | 895 |
| 27 | 8 | 949 |
| 28 | 2 | reserved |
| 29 | 4 | |
| 30 | 6 | |
| 31 | 8 | |

In some embodiments, yet another exemplary MCS table for the use of sending a PUSCH (Physical Uplink Shared Channel) signal with a maximum modulation order of 6 (64QAM) using DFT-S-OFDM (Discrete Fourier Transformation Spread Orthogonal Frequency Division Multiplexing) is shown in Table 9.

TABLE 9

| MCS Index $I_{MCS}$ | Modulation Order $Q_m$ | code rate × 1024 |
|---|---|---|
| 0 | 1 | 200 |
| 1 | 1 | 260 |
| 2 | 2 | 161 |
| 3 | 2 | 209 |
| 4 | 2 | 257 |
| 5 | 2 | 315 |
| 6 | 2 | 374 |
| 7 | 2 | 438 |
| 8 | 2 | 502 |
| 9 | 2 | 566 |
| 10 | 2 | 630 |
| 11 | 4 | 315 |
| 12 | 4 | 362 |
| 13 | 4 | 408 |
| 14 | 4 | 461 |
| 15 | 4 | 513 |
| 16 | 4 | 548 |
| 17 | 4 | 583 |
| 18 | 4 | 646 |
| 19 | 4 | 709 |
| 20 | 4 | 771 |
| 21 | 6 | 555 |
| 22 | 6 | 599 |
| 23 | 6 | 643 |

TABLE 9-continued

| MCS Index $I_{MCS}$ | Modulation Order $Q_m$ | code rate × 1024 |
|---|---|---|
| 24 | 6 | 685 |
| 25 | 6 | 727 |
| 26 | 6 | 759 |
| 27 | 6 | 790 |
| 28 | 1 | reserved |
| 29 | 2 | |
| 30 | 4 | |
| 31 | 6 | |

In some embodiments, yet another exemplary MCS table for the use of sending a PUSCH (Physical Uplink Shared Channel) signal with a maximum modulation order of 8 (256QAM) using DFT-S-OFDM (Discrete Fourier Transformation Spread Orthogonal Frequency Division Multiplexing) is shown in Table 10.

TABLE 10

| MCS Index $I_{MCS}$ | Modulation Order $Q_m$ | code rate × 1024 |
|---|---|---|
| 0 | 1 | 200 |
| 1 | 2 | 161 |
| 2 | 2 | 268 |
| 3 | 2 | 374 |
| 4 | 2 | 502 |
| 5 | 2 | 630 |
| 6 | 4 | 362 |
| 7 | 4 | 461 |
| 8 | 4 | 513 |
| 9 | 4 | 583 |
| 10 | 4 | 646 |
| 11 | 4 | 709 |
| 12 | 4 | 771 |
| 13 | 6 | 555 |
| 14 | 6 | 599 |
| 15 | 6 | 643 |
| 16 | 6 | 685 |
| 17 | 6 | 727 |
| 18 | 6 | 790 |
| 19 | 6 | 838 |
| 20 | 6 | 886 |
| 21 | 8 | 701 |
| 22 | 8 | 738 |
| 23 | 8 | 764 |
| 24 | 8 | 821 |
| 25 | 8 | 895 |
| 26 | 8 | 949 |
| 27 | 1 | reserved |
| 28 | 2 | |
| 29 | 4 | |
| 30 | 6 | |
| 31 | 8 | |

In some embodiments, once the BS selects the BG (either BG1 or BG2), the BG can use the QC-LDPC code, as known in the art, to encode the to-be transmitted information bits. Thus, steps performed by the BS to use the BG to encode the information bits will be herein briefly described:

Step 1. Calculate an intermediate parameter kb (when BG1 is selected, kb=22; when BG2 is selected and TBS is equal to or less than 192, kb=6; when BG2 is selected and TBS is greater than 192 and less than or equal to 560, kb=8; when BG2 is selected and TBS is greater than 560 and less than or equal to 640, kb=9; and when BG2 is selected and TBS is greater than 640, kb=10).

Step 2. Calculate a lifting value Z. The lifting value Z is selected as a minimum integer greater than or equal to TBS/kb.

Step 3. Based on a plurality of predefined tables (e.g., Tables 3, 4, and 5 provided below), retrieve a parity check matrix H using the lifting value Z, which will be discussed as follows.

In general, each BG is associated with a base graph matrix, $H_{BG}$. For BG1, the $H_{BG}$ includes 46 rows and with row indexes i=0, 1, 2, ..., 45 and 68 columns with column indexes j=0, 1, 2, ..., 67. For BG2, the $H_{BG}$ includes 42 rows with row indexes i=0, 1, 2, ..., 41 and 52 columns with column indexes j=0, 1, 2, ..., 51. The elements in the $H_{BG}$ with row and column indexes given in Table 11 (for BG1) and Table 12 (for BG 2) are of value 1, and all other elements in $H_{BG}$ are of value 0. Then, The matrix H is obtained by replacing each element of $H_{BG}$ with a Z×Z matrix, according to the following: each element of value 0 in $H_{BG}$ is replaced by an all zero matrix 0 of size Z×Z; each element of value 1 in $H_{BG}$ is replaced by a circular permutation matrix $I(P_{i,j})$ of size Z×Z, where i and j are the row and column indexes of the element, and $I(P_{i,j})$ is obtained by circularly shifting an identity matrix I of size Z×Z to the right $P_{i,j}$ times. The value, of $P_{i,j}$ is given by $P_{i,j}=\text{mod}(V_{i,j}, Z)$. The value of $V_{i,j}$ is given by Tables 3 and 4 according to a set index $i_{LS}$, which corresponds to a set of lifting values Z as shown in Table 13, and the base graph index (i.e., which BG is selected).

TABLE 11

$H_{BG}$

| Row index i | Column index j | $V_{i,j}$ Set index $i_{LS}$ | | | | | | | |
|---|---|---|---|---|---|---|---|---|---|
| | | 1 | 2 | 3 | 4 | 5 | 6 | 7 | 8 |
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 188 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 39 | 10 | 4 | 165 | 0 | 83 |
| | 9 | 59 | 317 | 15 | 0 | 29 | 243 | 0 | 53 |
| | 10 | 229 | 288 | 162 | 205 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 221 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |

TABLE 11-continued $H_{BG}$

| Row index i | Column index j | $V_{i,j}$ Set index $i_{LS}$ | | | | | | | |
|---|---|---|---|---|---|---|---|---|---|
| | | 1 | 2 | 3 | 4 | 5 | 6 | 7 | 8 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |
| | 6 | 93 | 161 | 227 | 186 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 235 | 256 | 204 | 211 |
| | 26 | 0 | 0 | 0 | 0 | 0 | 0 | 0 | 0 |
| 5 | 0 | 205 | 195 | 83 | 164 | 261 | 219 | 185 | 2 |
| | 1 | 236 | 14 | 292 | 59 | 181 | 130 | 100 | 171 |
| | 3 | 194 | 115 | 50 | 86 | 72 | 251 | 24 | 47 |
| | 12 | 231 | 166 | 318 | 80 | 283 | 322 | 65 | 143 |
| | 16 | 28 | 241 | 201 | 182 | 254 | 295 | 207 | 210 |
| | 21 | 123 | 51 | 267 | 130 | 79 | 258 | 161 | 180 |
| | 22 | 115 | 157 | 279 | 153 | 144 | 283 | 72 | 180 |
| | 27 | 0 | 0 | 0 | 0 | 0 | 0 | 0 | 0 |
| 6 | 0 | 183 | 278 | 289 | 158 | 80 | 294 | 6 | 199 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 220 | 9 | 12 | 17 | 169 | 3 | 145 | 77 |
| | 1 | 44 | 62 | 88 | 76 | 189 | 103 | 88 | 146 |
| | 4 | 159 | 316 | 207 | 104 | 154 | 224 | 112 | 209 |
| | 7 | 31 | 333 | 50 | 100 | 184 | 297 | 153 | 32 |
| | 8 | 167 | 290 | 25 | 150 | 104 | 215 | 159 | 166 |
| | 14 | 104 | 114 | 76 | 158 | 164 | 39 | 76 | 18 |
| | 29 | 0 | 0 | 0 | 0 | 0 | 0 | 0 | 0 |
| 8 | 0 | 112 | 307 | 295 | 33 | 54 | 348 | 172 | 181 |
| | 1 | 4 | 179 | 133 | 95 | 0 | 75 | 2 | 105 |
| | 3 | 7 | 165 | 130 | 4 | 252 | 22 | 131 | 141 |
| | 12 | 211 | 18 | 231 | 217 | 41 | 312 | 141 | 223 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 199 |
| | 22 | 241 | 67 | 245 | 44 | 230 | 314 | 35 | 153 |
| | 24 | 90 | 170 | 154 | 201 | 54 | 244 | 116 | 38 |
| | 30 | 0 | 0 | 0 | 0 | 0 | 0 | 0 | 0 |

TABLE 11-continued $H_{BG}$

| Row index i | Column index j | $V_{i,j}$ Set index $i_{LS}$ ||||||||
|---|---|---|---|---|---|---|---|---|---|
| | | 1 | 2 | 3 | 4 | 5 | 6 | 7 | 8 |
| 9 | 0 | 103 | 366 | 189 | 9 | 162 | 156 | 6 | 169 |
| | 1 | 182 | 232 | 244 | 37 | 159 | 88 | 10 | 12 |
| | 10 | 109 | 321 | 36 | 213 | 93 | 293 | 145 | 206 |
| | 11 | 21 | 133 | 286 | 105 | 134 | 111 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 101 | 14 | 82 | 178 | 175 | 126 | 116 |
| | 2 | 149 | 339 | 80 | 165 | 1 | 253 | 77 | 151 |
| | 4 | 167 | 274 | 211 | 174 | 28 | 27 | 156 | 70 |
| | 7 | 160 | 111 | 75 | 19 | 267 | 231 | 16 | 230 |
| | 8 | 49 | 383 | 161 | 194 | 234 | 49 | 12 | 115 |
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 6 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 166 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 6 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |
| | 10 | 73 | 229 | 23 | 130 | 90 | 16 | 88 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 61 | 256 | 162 | 128 | 19 | 222 | 194 | 108 |
| | 53 | 0 | 0 | 0 | 0 | 0 | 0 | 0 | 0 |
| 32 | 0 | 221 | 102 | 210 | 192 | 0 | 351 | 6 | 103 |
| | 12 | 112 | 201 | 22 | 209 | 211 | 265 | 126 | 110 |
| | 14 | 199 | 175 | 271 | 58 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |

TABLE 11-continued $H_{BG}$

| Row index | Column index | $V_{i,j}$ Set index $i_{LS}$ | | | | | | | |
|---|---|---|---|---|---|---|---|---|---|
| i | j | 1 | 2 | 3 | 4 | 5 | 6 | 7 | 8 |
| | 55 | 0 | 0 | 0 | 0 | 0 | 0 | 0 | 0 |
| 34 | 0 | 127 | 230 | 187 | 82 | 197 | 60 | 4 | 161 |
| | 7 | 167 | 148 | 296 | 186 | 0 | 320 | 153 | 237 |
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 65 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 235 | 153 | 93 |
| | 67 | 0 | 0 | 0 | 0 | 0 | 0 | 0 | 0 |

TABLE 12

$H_{BG}$

| Row index | Column index | $V_{i,j}$ Set index $i_{LS}$ | | | | | | | |
|---|---|---|---|---|---|---|---|---|---|
| i | j | 1 | 2 | 3 | 4 | 5 | 6 | 7 | 8 |
| 0 | 0 | 9 | 174 | 0 | 72 | 3 | 156 | 143 | 145 |
| | 1 | 117 | 97 | 0 | 110 | 26 | 143 | 19 | 131 |
| | 2 | 204 | 166 | 0 | 23 | 53 | 14 | 176 | 71 |

TABLE 12-continued $H_{BG}$

| Row index | Column index | $V_{i,j}$ Set index $i_{LS}$ | | | | | | | |
|---|---|---|---|---|---|---|---|---|---|
| i | j | 1 | 2 | 3 | 4 | 5 | 6 | 7 | 8 |
| | 3 | 26 | 66 | 0 | 181 | 35 | 3 | 165 | 21 |
| | 6 | 189 | 71 | 0 | 95 | 115 | 40 | 196 | 23 |
| | 9 | 205 | 172 | 0 | 8 | 127 | 123 | 13 | 112 |
| | 10 | 0 | 0 | 0 | 1 | 0 | 0 | 0 | 1 |
| | 11 | 0 | 0 | 0 | 0 | 0 | 0 | 0 | 0 |
| 1 | 0 | 167 | 27 | 137 | 53 | 19 | 17 | 18 | 142 |
| | 3 | 166 | 36 | 124 | 156 | 94 | 65 | 27 | 174 |
| | 4 | 253 | 48 | 0 | 115 | 104 | 63 | 3 | 183 |
| | 5 | 125 | 92 | 0 | 156 | 66 | 1 | 102 | 27 |
| | 6 | 226 | 31 | 88 | 115 | 84 | 55 | 185 | 96 |
| | 7 | 156 | 187 | 0 | 200 | 98 | 37 | 17 | 23 |
| | 8 | 224 | 185 | 0 | 29 | 69 | 171 | 14 | 9 |
| | 9 | 252 | 3 | 55 | 31 | 50 | 133 | 180 | 167 |
| | 11 | 0 | 0 | 0 | 0 | 0 | 0 | 0 | 0 |
| | 12 | 0 | 0 | 0 | 0 | 0 | 0 | 0 | 0 |
| 2 | 0 | 81 | 25 | 20 | 152 | 95 | 98 | 126 | 74 |
| | 1 | 114 | 114 | 94 | 131 | 106 | 168 | 163 | 31 |
| | 3 | 44 | 117 | 99 | 46 | 92 | 107 | 47 | 3 |
| | 4 | 52 | 110 | 9 | 191 | 110 | 82 | 183 | 53 |
| | 8 | 240 | 114 | 108 | 91 | 111 | 142 | 132 | 155 |
| | 10 | 1 | 1 | 1 | 0 | 1 | 1 | 1 | 0 |
| | 12 | 0 | 0 | 0 | 0 | 0 | 0 | 0 | 0 |
| | 13 | 0 | 0 | 0 | 0 | 0 | 0 | 0 | 0 |
| 3 | 1 | 8 | 136 | 38 | 185 | 120 | 53 | 36 | 239 |
| | 2 | 58 | 175 | 15 | 6 | 121 | 174 | 48 | 171 |
| | 4 | 158 | 113 | 102 | 36 | 22 | 174 | 18 | 95 |
| | 5 | 104 | 72 | 146 | 124 | 4 | 127 | 111 | 110 |
| | 6 | 209 | 123 | 12 | 124 | 73 | 17 | 203 | 159 |
| | 7 | 54 | 118 | 57 | 110 | 49 | 89 | 3 | 199 |
| | 8 | 18 | 28 | 53 | 156 | 128 | 17 | 191 | 43 |
| | 9 | 128 | 186 | 46 | 133 | 79 | 105 | 160 | 75 |
| | 10 | 0 | 0 | 0 | 1 | 0 | 0 | 0 | 1 |
| | 13 | 0 | 0 | 0 | 0 | 0 | 0 | 0 | 0 |
| 4 | 0 | 179 | 72 | 0 | 200 | 42 | 86 | 43 | 29 |
| | 1 | 214 | 74 | 136 | 16 | 24 | 67 | 27 | 140 |
| | 11 | 71 | 29 | 157 | 101 | 51 | 83 | 117 | 180 |
| | 14 | 0 | 0 | 0 | 0 | 0 | 0 | 0 | 0 |
| 5 | 0 | 231 | 10 | 0 | 185 | 40 | 79 | 136 | 121 |
| | 1 | 41 | 44 | 131 | 138 | 140 | 84 | 49 | 41 |
| | 5 | 194 | 121 | 142 | 170 | 84 | 35 | 36 | 169 |
| | 7 | 159 | 80 | 141 | 219 | 137 | 103 | 132 | 88 |
| | 11 | 103 | 48 | 64 | 193 | 71 | 60 | 62 | 207 |
| | 15 | 0 | 0 | 0 | 0 | 0 | 0 | 0 | 0 |
| 6 | 0 | 155 | 129 | 0 | 123 | 109 | 47 | 7 | 137 |
| | 5 | 228 | 92 | 124 | 55 | 87 | 154 | 34 | 72 |
| | 7 | 45 | 100 | 99 | 31 | 107 | 10 | 198 | 172 |
| | 9 | 28 | 49 | 45 | 222 | 133 | 155 | 168 | 124 |
| | 11 | 158 | 184 | 148 | 209 | 139 | 29 | 12 | 56 |
| | 16 | 0 | 0 | 0 | 0 | 0 | 0 | 0 | 0 |
| 7 | 1 | 129 | 80 | 0 | 103 | 97 | 48 | 163 | 86 |
| | 5 | 147 | 186 | 45 | 13 | 135 | 125 | 78 | 186 |
| | 7 | 140 | 16 | 148 | 105 | 35 | 24 | 143 | 87 |
| | 11 | 3 | 102 | 96 | 150 | 108 | 47 | 107 | 172 |
| | 13 | 116 | 143 | 78 | 181 | 65 | 55 | 58 | 154 |
| | 17 | 0 | 0 | 0 | 0 | 0 | 0 | 0 | 0 |
| 8 | 0 | 142 | 118 | 0 | 147 | 70 | 53 | 101 | 176 |
| | 1 | 94 | 70 | 65 | 43 | 69 | 31 | 177 | 169 |
| | 12 | 230 | 152 | 87 | 152 | 88 | 161 | 22 | 225 |
| | 18 | 0 | 0 | 0 | 0 | 0 | 0 | 0 | 0 |
| 9 | 1 | 203 | 28 | 0 | 2 | 97 | 104 | 186 | 167 |
| | 8 | 205 | 132 | 97 | 30 | 40 | 142 | 27 | 238 |
| | 10 | 61 | 185 | 51 | 184 | 24 | 99 | 205 | 48 |
| | 11 | 247 | 178 | 85 | 83 | 49 | 64 | 81 | 68 |
| | 19 | 0 | 0 | 0 | 0 | 0 | 0 | 0 | 0 |
| 10 | 0 | 11 | 59 | 0 | 174 | 46 | 111 | 125 | 38 |
| | 1 | 185 | 104 | 17 | 150 | 41 | 25 | 60 | 217 |
| | 6 | 0 | 22 | 156 | 8 | 101 | 174 | 177 | 208 |
| | 7 | 117 | 52 | 20 | 56 | 96 | 23 | 51 | 232 |
| | 20 | 0 | 0 | 0 | 0 | 0 | 0 | 0 | 0 |
| 11 | 0 | 11 | 32 | 0 | 99 | 28 | 91 | 39 | 178 |
| | 7 | 236 | 92 | 7 | 138 | 30 | 175 | 29 | 214 |
| | 9 | 210 | 174 | 4 | 110 | 116 | 24 | 35 | 168 |
| | 13 | 56 | 154 | 2 | 99 | 64 | 141 | 8 | 51 |

TABLE 12-continued

| $H_{BG}$ Row index i | Column index j | $V_{i,j}$ Set index $i_{LS}$ 1 | 2 | 3 | 4 | 5 | 6 | 7 | 8 |
|---|---|---|---|---|---|---|---|---|---|
|  | 21 | 0 | 0 | 0 | 0 | 0 | 0 | 0 | 0 |
| 12 | 1 | 63 | 39 | 0 | 46 | 33 | 122 | 18 | 124 |
|  | 3 | 111 | 93 | 113 | 217 | 122 | 11 | 155 | 122 |
|  | 11 | 14 | 11 | 48 | 109 | 131 | 4 | 49 | 72 |
|  | 22 | 0 | 0 | 0 | 0 | 0 | 0 | 0 | 0 |
| 13 | 0 | 83 | 49 | 0 | 37 | 76 | 29 | 32 | 48 |
|  | 1 | 2 | 125 | 112 | 113 | 37 | 91 | 53 | 57 |
|  | 8 | 38 | 35 | 102 | 143 | 62 | 27 | 95 | 167 |
|  | 13 | 222 | 166 | 26 | 140 | 47 | 127 | 186 | 219 |
|  | 23 | 0 | 0 | 0 | 0 | 0 | 0 | 0 | 0 |
| 14 | 1 | 115 | 19 | 0 | 36 | 143 | 11 | 91 | 82 |
|  | 6 | 145 | 118 | 138 | 95 | 51 | 145 | 20 | 232 |
|  | 11 | 3 | 21 | 57 | 40 | 130 | 8 | 52 | 204 |
|  | 13 | 232 | 163 | 27 | 116 | 97 | 166 | 109 | 162 |
|  | 24 | 0 | 0 | 0 | 0 | 0 | 0 | 0 | 0 |
| 15 | 0 | 51 | 68 | 0 | 116 | 139 | 137 | 174 | 38 |
|  | 10 | 175 | 63 | 73 | 200 | 96 | 103 | 108 | 217 |
|  | 11 | 213 | 81 | 99 | 110 | 128 | 40 | 102 | 157 |
|  | 25 | 0 | 0 | 0 | 0 | 0 | 0 | 0 | 0 |
| 16 | 1 | 203 | 87 | 0 | 75 | 48 | 78 | 125 | 170 |
|  | 9 | 142 | 177 | 79 | 158 | 9 | 158 | 31 | 23 |
|  | 11 | 8 | 135 | 111 | 134 | 28 | 17 | 54 | 175 |
|  | 12 | 242 | 64 | 143 | 97 | 8 | 165 | 176 | 202 |
|  | 26 | 0 | 0 | 0 | 0 | 0 | 0 | 0 | 0 |
| 17 | 1 | 254 | 158 | 0 | 48 | 120 | 134 | 57 | 196 |
|  | 5 | 124 | 23 | 24 | 132 | 43 | 23 | 201 | 173 |
|  | 11 | 114 | 9 | 109 | 206 | 65 | 62 | 142 | 195 |
|  | 12 | 64 | 6 | 18 | 2 | 42 | 163 | 35 | 218 |
|  | 27 | 0 | 0 | 0 | 0 | 0 | 0 | 0 | 0 |
| 18 | 0 | 220 | 186 | 0 | 68 | 17 | 173 | 129 | 128 |
|  | 6 | 194 | 6 | 18 | 16 | 106 | 31 | 203 | 211 |
|  | 7 | 50 | 46 | 86 | 156 | 142 | 22 | 140 | 210 |
|  | 28 | 0 | 0 | 0 | 0 | 0 | 0 | 0 | 0 |
| 19 | 0 | 87 | 58 | 0 | 35 | 79 | 13 | 110 | 39 |
|  | 1 | 20 | 42 | 158 | 138 | 28 | 135 | 124 | 84 |
|  | 10 | 185 | 156 | 154 | 86 | 41 | 145 | 52 | 88 |
|  | 29 | 0 | 0 | 0 | 0 | 0 | 0 | 0 | 0 |
| 20 | 1 | 26 | 76 | 0 | 6 | 2 | 128 | 196 | 117 |
|  | 4 | 105 | 61 | 148 | 20 | 103 | 52 | 35 | 227 |
|  | 11 | 29 | 153 | 104 | 141 | 78 | 173 | 114 | 6 |
|  | 30 | 0 | 0 | 0 | 0 | 0 | 0 | 0 | 0 |
| 21 | 0 | 76 | 157 | 0 | 80 | 91 | 156 | 10 | 238 |
|  | 8 | 42 | 175 | 17 | 43 | 75 | 166 | 122 | 13 |
|  | 13 | 210 | 67 | 33 | 81 | 81 | 40 | 23 | 11 |
|  | 31 | 0 | 0 | 0 | 0 | 0 | 0 | 0 | 0 |
| 22 | 1 | 222 | 20 | 0 | 49 | 54 | 18 | 202 | 195 |
|  | 2 | 63 | 52 | 4 | 1 | 132 | 163 | 126 | 44 |
|  | 32 | 0 | 0 | 0 | 0 | 0 | 0 | 0 | 0 |
| 23 | 0 | 23 | 106 | 0 | 156 | 68 | 110 | 52 | 5 |
|  | 3 | 235 | 86 | 75 | 54 | 115 | 132 | 170 | 94 |
|  | 5 | 238 | 95 | 158 | 134 | 56 | 150 | 13 | 111 |
|  | 33 | 0 | 0 | 0 | 0 | 0 | 0 | 0 | 0 |
| 24 | 1 | 46 | 182 | 0 | 153 | 30 | 113 | 113 | 81 |
|  | 2 | 139 | 153 | 69 | 88 | 42 | 108 | 161 | 19 |
|  | 9 | 8 | 64 | 87 | 63 | 101 | 61 | 88 | 130 |
|  | 34 | 0 | 0 | 0 | 0 | 0 | 0 | 0 | 0 |
| 25 | 0 | 228 | 45 | 0 | 211 | 128 | 72 | 197 | 66 |
|  | 5 | 156 | 21 | 65 | 94 | 63 | 136 | 194 | 95 |
|  | 35 | 0 | 0 | 0 | 0 | 0 | 0 | 0 | 0 |
| 26 | 2 | 29 | 67 | 0 | 90 | 142 | 36 | 164 | 146 |
|  | 7 | 143 | 137 | 100 | 6 | 28 | 38 | 172 | 66 |
|  | 12 | 160 | 55 | 13 | 221 | 100 | 53 | 49 | 190 |
|  | 13 | 122 | 85 | 7 | 6 | 133 | 145 | 161 | 86 |
|  | 36 | 0 | 0 | 0 | 0 | 0 | 0 | 0 | 0 |
| 27 | 0 | 8 | 103 | 0 | 27 | 13 | 42 | 168 | 64 |
|  | 6 | 151 | 50 | 32 | 118 | 10 | 104 | 193 | 181 |
|  | 37 | 0 | 0 | 0 | 0 | 0 | 0 | 0 | 0 |
| 28 | 1 | 98 | 70 | 0 | 216 | 106 | 64 | 14 | 7 |
|  | 2 | 101 | 111 | 126 | 212 | 77 | 24 | 186 | 144 |
|  | 5 | 135 | 168 | 110 | 193 | 43 | 149 | 46 | 16 |
|  | 38 | 0 | 0 | 0 | 0 | 0 | 0 | 0 | 0 |
| 29 | 0 | 18 | 110 | 0 | 108 | 133 | 139 | 50 | 25 |
|  | 4 | 28 | 17 | 154 | 61 | 25 | 161 | 27 | 57 |
|  | 39 | 0 | 0 | 0 | 0 | 0 | 0 | 0 | 0 |
| 30 | 2 | 71 | 120 | 0 | 106 | 87 | 84 | 70 | 37 |
|  | 5 | 240 | 154 | 35 | 44 | 56 | 173 | 17 | 139 |
|  | 7 | 9 | 52 | 51 | 185 | 104 | 93 | 50 | 221 |
|  | 9 | 84 | 56 | 134 | 176 | 70 | 29 | 6 | 17 |
|  | 40 | 0 | 0 | 0 | 0 | 0 | 0 | 0 | 0 |
| 31 | 1 | 106 | 3 | 0 | 147 | 80 | 117 | 115 | 201 |
|  | 13 | 1 | 170 | 20 | 182 | 139 | 148 | 189 | 46 |
|  | 41 | 0 | 0 | 0 | 0 | 0 | 0 | 0 | 0 |
| 32 | 0 | 242 | 84 | 0 | 108 | 32 | 116 | 110 | 179 |
|  | 5 | 44 | 8 | 20 | 21 | 89 | 73 | 0 | 14 |
|  | 12 | 166 | 17 | 122 | 110 | 71 | 142 | 163 | 116 |
|  | 42 | 0 | 0 | 0 | 0 | 0 | 0 | 0 | 0 |
| 33 | 2 | 132 | 165 | 0 | 71 | 135 | 105 | 163 | 46 |
|  | 7 | 164 | 179 | 88 | 12 | 6 | 137 | 173 | 2 |
|  | 10 | 235 | 124 | 13 | 109 | 2 | 29 | 179 | 106 |
|  | 43 | 0 | 0 | 0 | 0 | 0 | 0 | 0 | 0 |
| 34 | 0 | 147 | 173 | 0 | 29 | 37 | 11 | 197 | 184 |
|  | 12 | 85 | 177 | 19 | 201 | 25 | 41 | 191 | 135 |
|  | 13 | 36 | 12 | 78 | 69 | 114 | 162 | 193 | 141 |
|  | 44 | 0 | 0 | 0 | 0 | 0 | 0 | 0 | 0 |
| 35 | 1 | 57 | 77 | 0 | 91 | 60 | 126 | 157 | 85 |
|  | 5 | 40 | 184 | 157 | 165 | 137 | 152 | 167 | 225 |
|  | 11 | 63 | 18 | 6 | 55 | 93 | 172 | 181 | 175 |
|  | 45 | 0 | 0 | 0 | 0 | 0 | 0 | 0 | 0 |
| 36 | 0 | 140 | 25 | 0 | 1 | 121 | 73 | 197 | 178 |
|  | 2 | 38 | 151 | 63 | 175 | 129 | 154 | 167 | 112 |
|  | 7 | 154 | 170 | 82 | 83 | 26 | 129 | 179 | 106 |
|  | 46 | 0 | 0 | 0 | 0 | 0 | 0 | 0 | 0 |
| 37 | 10 | 219 | 37 | 0 | 40 | 97 | 167 | 181 | 154 |
|  | 13 | 151 | 31 | 144 | 12 | 56 | 38 | 193 | 114 |
|  | 47 | 0 | 0 | 0 | 0 | 0 | 0 | 0 | 0 |
| 38 | 1 | 31 | 84 | 0 | 37 | 1 | 112 | 157 | 42 |
|  | 5 | 66 | 151 | 93 | 97 | 70 | 7 | 173 | 41 |
|  | 11 | 38 | 190 | 19 | 46 | 1 | 19 | 191 | 105 |
|  | 48 | 0 | 0 | 0 | 0 | 0 | 0 | 0 | 0 |
| 39 | 0 | 239 | 93 | 0 | 106 | 119 | 109 | 181 | 167 |
|  | 7 | 172 | 132 | 24 | 181 | 32 | 6 | 157 | 45 |
|  | 12 | 34 | 57 | 138 | 154 | 142 | 105 | 173 | 189 |
|  | 49 | 0 | 0 | 0 | 0 | 0 | 0 | 0 | 0 |
| 40 | 2 | 0 | 103 | 0 | 98 | 6 | 160 | 193 | 78 |
|  | 10 | 75 | 107 | 36 | 35 | 73 | 156 | 163 | 67 |
|  | 13 | 120 | 163 | 143 | 36 | 102 | 82 | 179 | 180 |
|  | 50 | 0 | 0 | 0 | 0 | 0 | 0 | 0 | 0 |
| 41 | 1 | 129 | 147 | 0 | 120 | 48 | 132 | 191 | 53 |
|  | 5 | 229 | 7 | 2 | 101 | 47 | 6 | 197 | 215 |
|  | 11 | 118 | 60 | 55 | 81 | 19 | 8 | 167 | 230 |
|  | 51 | 0 | 0 | 0 | 0 | 0 | 0 | 0 | 0 |

TABLE 13

| Set index ($i_{LS}$) | Set of lifting sizes (Z) |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

After the parity check matrix H is determined, the information bits can be encoded as an QC-LDPC codeword. Next, as discussed above, the rate matching step, the interleaving step, and the symbol modulation step are respectively performed on the QC-LDPC codeword to generate one or more modulated symbols for transmission.

Figure 5:
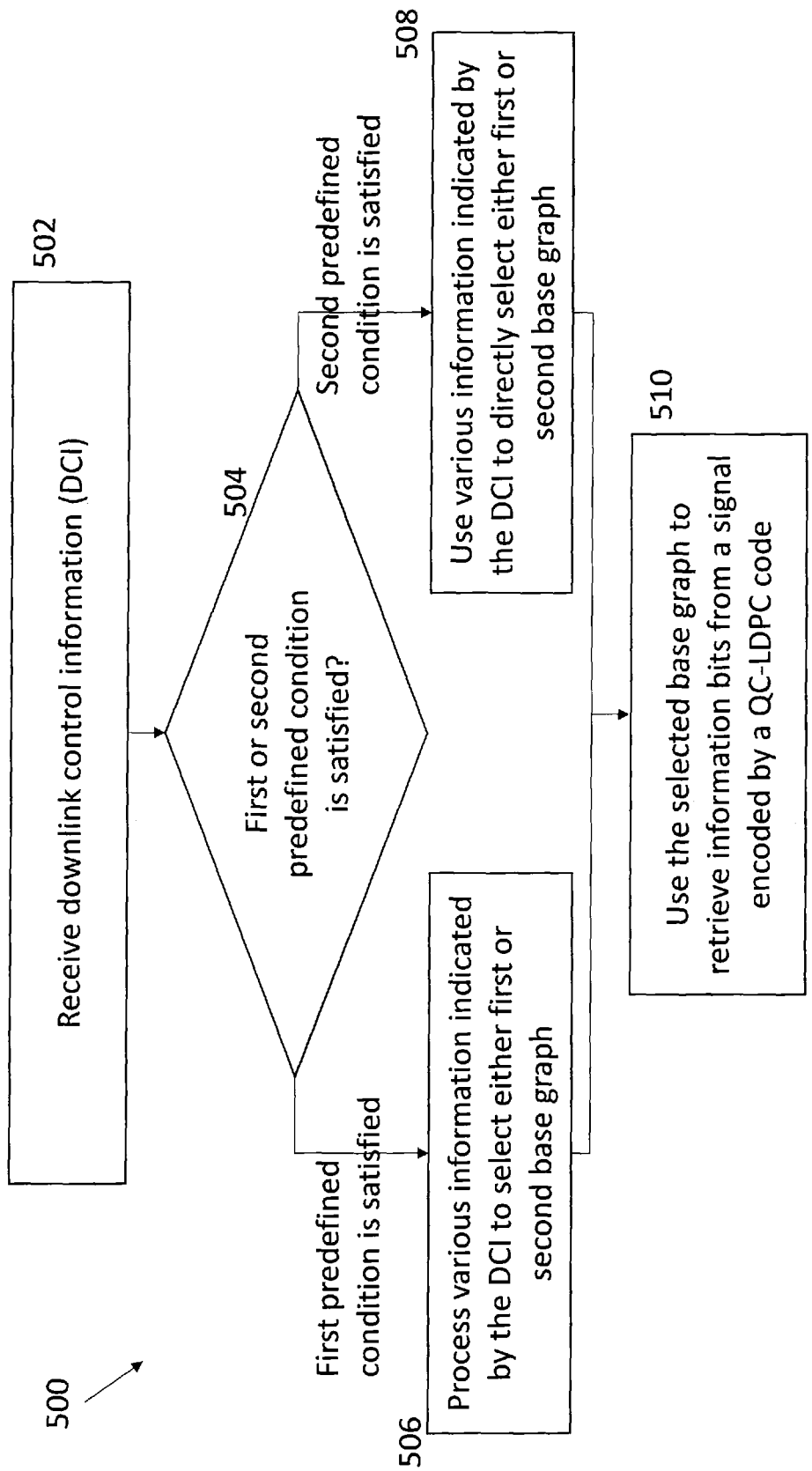
FIG. 5 illustrates a flow chart of an exemplary method to retrieve information bits from a signal encoded by a QC-LDPC code, in accordance with some embodiments of the present disclosure.

FIG. 5 illustrates a flow chart of an exemplary method 500 performed by a UE to retrieve information bits from a signal encoded by a QC-LDPC code, in accordance with some embodiments. The illustrated embodiment of the method 500 is merely an example. Therefore, it should be understood that any of a variety of operations may be omitted, re-sequenced, and/or added while remaining within the scope of the present disclosure. Since the method 500 performed by the UE is substantially similar to the method 300 performed by the BS except that encoding is replaced with decoding, the method 500 will be briefly discussed as follows.

In some embodiments, the method 500 starts with operation 502 in which downlink control information (DCI) is received. According to some embodiments, the DCI includes various information such as, for example, a modulation and coding scheme (MCS) index (hereinafter "$I_{MCS}$"), a new data indicator (hereinafter "NDI"), a redundancy version (hereinafter "RV"), a number of physical resource blocks (hereinafter "PRB"), etc. Next, the method 500 proceeds to determination operation 504 in which the UE determines whether a first or second predefined condition is satisfied. In some embodiments, the first predefined condition includes at least one of the following: whether the RV is equal to RV0, whether a current logic state of the NDI is equal to a logic "0," and whether the NDI presents a transition to a different logic state (e.g., whether the NDI has been toggled to a value different from a previously received value, which indicates a first transmission); and the second predefined condition includes at least one of the following: whether the RV is equal to RV1, RV2, or RV3, whether a current logic state of the NDI is equal to a logic "1," and whether the NDI lacks a transition to a different logic state (e.g., whether the NDI has been toggled to a value different from a previously received value, which indicates a retransmission). When the first predefined condition is satisfied, the method 500 proceeds to operation 506; and when the second predefined condition is satisfied, the method 500 proceeds to operation 508. In some embodiments, in operation 506, the UE is configured to process the various information contained in the DCI to select one from the above-mentioned BG1 and BG2 that are predefined by the QC-LDPC code; and on the other hand, in operation 508, the UE is configured to use the various information contained in the DCI to directly select one from the above-mentioned BG1 and BG2 (i.e., no further processing on the various information). It is noted that the above-described techniques performed by the BS in operation 306 can also be performed by the UE in operation 506 to select a BG, and the above-described techniques performed by the BS in operation 308 can also be performed by the UE in operation 508 to select a BG while remaining within the scope of the present disclosure. After the BG is selected either at operation 506 or 508, the method 500 continues to operation 510 in which the UE uses the selected BG to retrieve information bits from a signal encoded by the QC-LDPC code. In some embodiments, in operation 510, in addition to at least one decoding process using the selected BG being performed, one or more further steps (e.g., a symbol de-modulation step, a step to estimate a corresponding parity check matrix as mentioned above, a de-interleaving step, a de-rate matching step, etc.) may be performed before the information bits are decoded.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for encoding data, the method comprising:
receiving control information by a transceiver;
determining by at least one processor a redundancy version and a new data indicator indicated by the control information;
determining by the at least one processor a base graph of a low density parity check code based on which of a plurality of predefined conditions the redundancy version, and the new data indicator satisfy, wherein a first one of the plurality of predefined conditions comprises: the redundancy version being equal to a redundancy version 0, the new data indicator being equal to a first logic state, and the new data indicator being toggled, which indicates a first transmission of the encoded data, and wherein a second one of the plurality of predefined conditions comprises: the new data indicator being equal to a second logic state different from the first logic state, the new data indicator being not toggled, which indicates a retransmission of the encoded data, and the redundancy version being equal to one of a redundancy version 1, a redundancy version 2, or a redundancy version 3;
encoding by the at least one processor a signal comprising information bits based on the determined base graph of the low density parity check code; and
transmitting by the transceiver the encoded signal to a predetermined communication device.

2. The method of claim 1, wherein according to the first one of the plurality of predefined conditions being satisfied, the method further comprises:
determining a modulation order and a code rate based on a modulation and coding scheme index that is indicated by the control information;
determining a transport block size based on at least the modulation order and the code rate;
based on the code rate and the transport block size, determining the base graph as either a first or a second predefined base graph of the low density parity check code.

3. The method of claim 1, wherein according to the second one of the plurality of predefined conditions being satisfied, the method further comprises:
determining the base graph as either a first or a second predefined base graph of the low density parity check code directly according to a modulation and coding scheme index that is indicated by the control information.

4. The method of claim 3, further comprises:
determining the base graph as the first predefined base graph of the low density parity check code when the modulation and coding scheme index belongs to a first subset of a plurality of predefined modulation and coding scheme indexes; and
determining the base graph as the second predefined base graph of the low density parity check code when the modulation and coding scheme index belongs to a second subset of the plurality of predefined modulation and coding scheme indexes.

5. The method of claim 4, wherein each predefined modulation and coding scheme index in the first subset is an even integer and each predefined modulation and coding scheme index in the second subset is an odd integer, or each predefined modulation and coding scheme index in the first subset is an odd integer and each predefined modulation and coding scheme index in the second subset is an even integer.

6. The method of claim 4, wherein in the first subset, a number of a further subset of predefined modulation and coding scheme indexes is at least $b_0$% of a total number of the predefined modulation and coding scheme indexes in the first subset and a remainder after a division of each of the further subset of the first subset of predefined modulation and coding scheme indexes by an even integer is less than a half of the even integer, and in the second subset, a number of a further subset of predefined modulation and coding scheme indexes is at least $b_1$% of a total number of the predefined modulation and coding scheme indexes in the second subset and a remainder after a division of each of further subset of the second subset of predefined modulation and coding scheme indexes by the even integer is equal to or greater than the half of the even integer, and wherein $b_0$ is a first real number greater than 75 and less than 100 and $b_1$ is a second real number greater than 75 and less than 100.

7. The method of claim 4, wherein in the first subset, a number of a further subset of predefined modulation and coding scheme indexes is at least 60% of a total number of the predefined modulation and coding scheme indexes in the first subset and each of the further subset of the first subset of predefined modulation and coding scheme indexes is greater than N', and in the second subset, a number of a further subset of predefined modulation and coding scheme indexes is at least 60% of a total number of the predefined modulation and coding scheme indexes in the second subset and each of the further subset of the second subset of predefined modulation and coding scheme indexes is less than N', and wherein N' is equal to a sum of the total number of the predefined modulation and coding scheme indexes in the first subset and the total number of the predefined modulation and coding scheme indexes in the second subset.

8. The method of claim 5, wherein according to the second one of the plurality of predefined conditions being satisfied, the method further comprises:
determining the base graph as either a first or a second predefined base graph of the low density parity check code directly according to a modulation and coding scheme table that indicates a relationship between a modulation and coding scheme index, indicated by the control information, and a base graph index.

9. The method of claim 1, wherein according to the second one of the plurality of predefined conditions being satisfied, the method further comprises:
determining the base graph as either a first or a second predefined base graph of the low density parity check code directly based on a modulation and coding scheme index, indicated by the control information, and a code rate corresponding to the modulation and coding scheme index.

10. The method of claim 9, further comprising:
according to the code rate being greater than a first threshold, determining the base graph as the first predefined base graph; and
according to the code rate being less than or equal to a second threshold, determining the base graph as the second predefined base graph,
wherein the first and second thresholds are each a real number less than 1.

11. The method of claim 10, wherein the first threshold is greater than the second threshold.

12. The method of claim 1, wherein according to the second one of the plurality of predefined conditions being satisfied, the method further comprises:
determining the base graph as either a first or a second predefined base graph of the low density parity check code directly based on a modulation and coding scheme index and a number of physical resource blocks that are both indicated by the control information.

13. The method of claim 12, further comprising:
according to a remainder after division of the modulation and coding scheme index by 2 being equal to a remainder after division of the number of physical resource blocks by 2, determining the base graph as the first predefined base graph; and
according to the remainder after division of the modulation and coding scheme index by 2 being not equal to the remainder after division of the number of physical resource blocks by 2, determining the base graph as the second predefined base graph.

14. The method of claim 12, further comprising:
according to a remainder after division of the modulation and coding scheme index by 2 being not equal to a remainder after division of the number of physical resource blocks by 2, determining the base graph as the first predefined base graph; and
according to the remainder after division of the modulation and coding scheme index by 2 being equal to the remainder after division of the number of physical resource blocks by 2, determining the base graph as the second predefined base graph.

15. The method of claim 1, wherein according to either the first or second one of the plurality of predefined conditions being satisfied, the method further comprises:
determining the base graph as either a first or a second predefined base graph of the low density parity check code based on a relationship between a first efficiency value derived from a modulation and coding scheme table and a second efficiency value indicated in a channel quality indicator table,
wherein the first efficiency value is derived as a product of a modulation order being multiplied by a code rate, and wherein in the modulation and coding scheme table, the modulation order and code rate correspond to a respective modulation and coding scheme index.

16. The method of claim 15, wherein the modulation and coding scheme table comprises a plurality of modulation and coding scheme indexes that are grouped into at least three subsets and the channel quality indicator table comprises a plurality of second efficiency values, and wherein a corresponding first efficiency value of each modulation and coding scheme index in a first subset is equal to any of the plurality of second efficiency values in the channel quality indicator table, a corresponding first efficiency value of each modulation and coding scheme index in a second subset is equal to an average of any two adjacent ones of the plurality of second efficiency values in the channel quality indicator table, a corresponding first efficiency value of each modulation and coding scheme index in a third subset is not equal to any first efficiency value associated with the first and second subsets.

17. The method of claim 15, wherein a maximum code rate in the modulation and coding scheme table is equal to $0.95+\Delta x$ wherein $\Delta x$ is a real number between $-0.01$ and $+0.01$.

18. The method of claim 17, wherein the modulation and coding scheme table and the channel quality indicator table are each used by a downlink transmission with a maximum modulation order being equal to 8.

* * * * *